United States Patent [19]

Borowski et al.

[11] 4,354,747

[45] Oct. 19, 1982

[54] SWITCHING CIRCUIT FOR REGULATION OF CAMERA FUNCTIONS

[75] Inventors: Kurt Borowski, Aschheim; Reinhard Nicko; Istvan Cocron, both of Munich; Dieter Engelsmann, Unterhaching, all of Fed. Rep. of Germany

[73] Assignee: Agfa-Gevaert Aktiengesellschaft, Leverkusen, Fed. Rep. of Germany

[21] Appl. No.: 242,104

[22] Filed: Mar. 9, 1981

[30] Foreign Application Priority Data

Mar. 8, 1980 [DE] Fed. Rep. of Germany ....... 3009011

[51] Int. Cl.$^3$ .......................... G03B 1/18; G03B 7/26; H01H 47/00
[52] U.S. Cl. ................................ 354/23 D; 354/50; 354/60 R; 354/60 A; 354/173; 354/234; 307/132 E; 307/132 M; 307/140; 307/143
[58] Field of Search .............. 354/23 D, 50, 51, 60 R, 354/60 A, 171, 173, 234, 235, 266–268, 289; 307/132 R, 132 E, 132 M, 132 V, 134, 137, 139, 140, 142, 143

[56] References Cited

U.S. PATENT DOCUMENTS 3,810,228  5/1974  Taguchi et al. ............. 354/60 R X
4,200,375  4/1980  Ishiguro et al. ............. 354/23 D X Primary Examiner—L. T. Hix
Assistant Examiner—William B. Perkey
Attorney, Agent, or Firm—Kontler, Grimes & Battersby

[57] ABSTRACT

A digital circuit is described for controlling functions of a camera wherein the circuit is powered by a potential source which is connected to the circuit through a relay actuated switch. The circuit employs a plurality of D-flip flops to regulate functions such as film transport and opening and closing of the camera shutter as a function of the light intensity of the scene being photographed. A reset signal generator is used to provide stable and reliable control over the starting condition of the flip flops and render the circuit insensitive to voltage transients as may occur from contact bounce effects at the relay actuated switch. The reset signal generator employs an inverter delay chain to provide like reset pulses when such contact bounce occurs. Various control features are described.

26 Claims, 3 Drawing Figures

SWITCHING CIRCUIT FOR REGULATION OF CAMERA FUNCTIONS

BACKGROUND OF THE INVENTION

This invention generally relates to a circuit for the regulation of camera functions. More specifically, this invention relates to a switching circuit for control of camera functions such as forming or indicating exposure values, camera focusing, film transport, or electronic flash formation, in photographic or cinematographic cameras and the like.

OBJECTS AND SUMMARY OF THE INVENTION

An object of the invention is to provide a digital switching circuit to safely regulate camera function, even though electric power from a battery is intermittently applied to energize various control circuits through an operation control switch. It is a further object of the invention to maintain the proper sequence of operations in a camera digital control circuit even in the presence of contact bounce between contacts of an operation control switch through which electrical power from a potential source such as a battery is supplied when the camera is activated.

In accordance with one embodiment of the invention, camera functions are controlled with control circuits which are energized by a battery through an operation control switch having a first contact coupled to the battery and a second contact coupled to energize the control circuits. A reset signal generator is used to produce reset signals both in response to the application of electrical power and bouncing effects between the first and second contacts of the operation control switch. At least one bistable device is employed which has a reset input, responsive to the reset signals so that its output, which is connected to regulate various control circuits, establishes a predetermined state to thus enable proper sequencing of the camera functions by the control circuit.

As further described herein with respect to a preferred embodiment, the reset signal generator is formed with a chain of signal inverting delaying devices whereby voltage transients introduced by switch contact bouncing generate like reset pulses which ensure that the camera control circuits invariably assume correct initial predetermined switch conditions.

With a circuit in accordance with the invention, unstable camera control circuit conditions are avoided during turn on and the circuit rendered essentially immune to contact bounce effects. As a result, predetermined switch conditions for bistable devices used to regulate the camera functions are reliably established.

As further described herein for a circuit in accordance with the invention, the bistable devices are preferably D- flip flops. A relay is provided in series with a semiconductor switch or transistor which is controlled by the output of a bistable device. The relay, which is directly connected with a source of potential such as a battery, is initially solely energized by a manually actuated release switch connected to parallel with the semiconductor switch.

However, shortly after the camera shutter is opened, a pulse is produced by a starting switch actuated by the camera shutter release mechanism. This pulse is applied to cause the bistable device to flip to a state whereby the semiconductor switch in series with the relay is closed to thus latch the relay into an energized state.

As further described for a circuit in accordance with the invention, a timer circuit is used to produce a stop signal after a lapse of a predetermined time interval. The stop signal is applied to return the relay latching bistable device to its reset state and thus disconnect the battery from the circuit. Since the relay regulates, by way of its control over the operation control switch, the application of electrical power to the circuit, it is particularly important to achieve stable conditions of the bistable device that, in turn, controls the relay. For example, during opening of the operation control switch, a contact bounce effect could inadvertently reactivate the bistable device leading to false operation of the circuit for the camera functions and undesirable energy drain of the battery. These disadvantages are avoided with a circuit in accordance with the invention.

In accordance with another feature of the invention, a mechanical timer is provided in association with the film transport drive. The timer is used to deactivate a starter switch initially activated when the camera shutter was opened. The timer operates after an interval of time commensurate with the time required to transport the camera film the length of a film frame. The deactivation of the starting switch enables a reset of a bistable device and thus opening of the main control switch and an interruption of electrical power.

In accordance with another feature of the invention, logic circuits are employed to respond to the conditions of a switch associated with the film transporting motor. With these logic circuits, an automatic disconnection of the battery from the circuit is obtained after the film transporting motor has moved the film to a new frame exposure position. Such disconnection is assured with a counter which generates a pulse after a maximum time interval and applies the pulse to the logic circuits.

Another advantageous embodiment of the invention employs a D- flip flop to reset counters used in the circuit when electrical power is first applied. The D input of the flip flop is connected to a reference potential while its timing input is responsive to the actuation of the starter switch. Since the latter switch is rendered active at the opening of the camera shutter, the D- flip flop is promptly reset to thus permit a counter to count pulses from a pulse generator, the frequency of which varies as a function of changes in light intensity of the scene being photographed. Since the D- flip flop has its reset input coupled to an inverting time delay stage, the D- flip flop has, upon turning on or off of the circuit, a predetermined state. This advantageously assures that the counters in the circuit receive the proper reset pulse, even in the presence of voltage transients introduced by contact bounce of the operation control switch during turn-on and turn-off of the circuit.

In accordance with another feature of the invention, a D- flip flop is employed to regulate the opening of the camera shutter as soon as power is applied to the circuit. An output of the flip flop is coupled through semiconductor switches or transistors to an electromagnet which causes the camera shutter to open. A closure of the camera shutter is obtained by applying outputs representative of predetermined counts in a pair of counters through an OR gate to the clock input of the D- flip flop. The latter has its D input connected to a fixed potential to switch the flip flop when either of the counters has reached its predetermined count. Since one of the counters receives pulses at a frequency which is a function of the intensity of light of the scene being photographed, the shutter opening is correspondingly controlled. The other counter receives pulses from a pulse generator so that closure of the shutter is assured at least after some maximum fixed time.

These and other objects and advantages of the invention can be understood from the following detailed description of an embodiment which is described in conjunction with the drawings.

DETAILED DESCRIPTION OF THE PREFERRED EMBODIMENT

Figure 2:
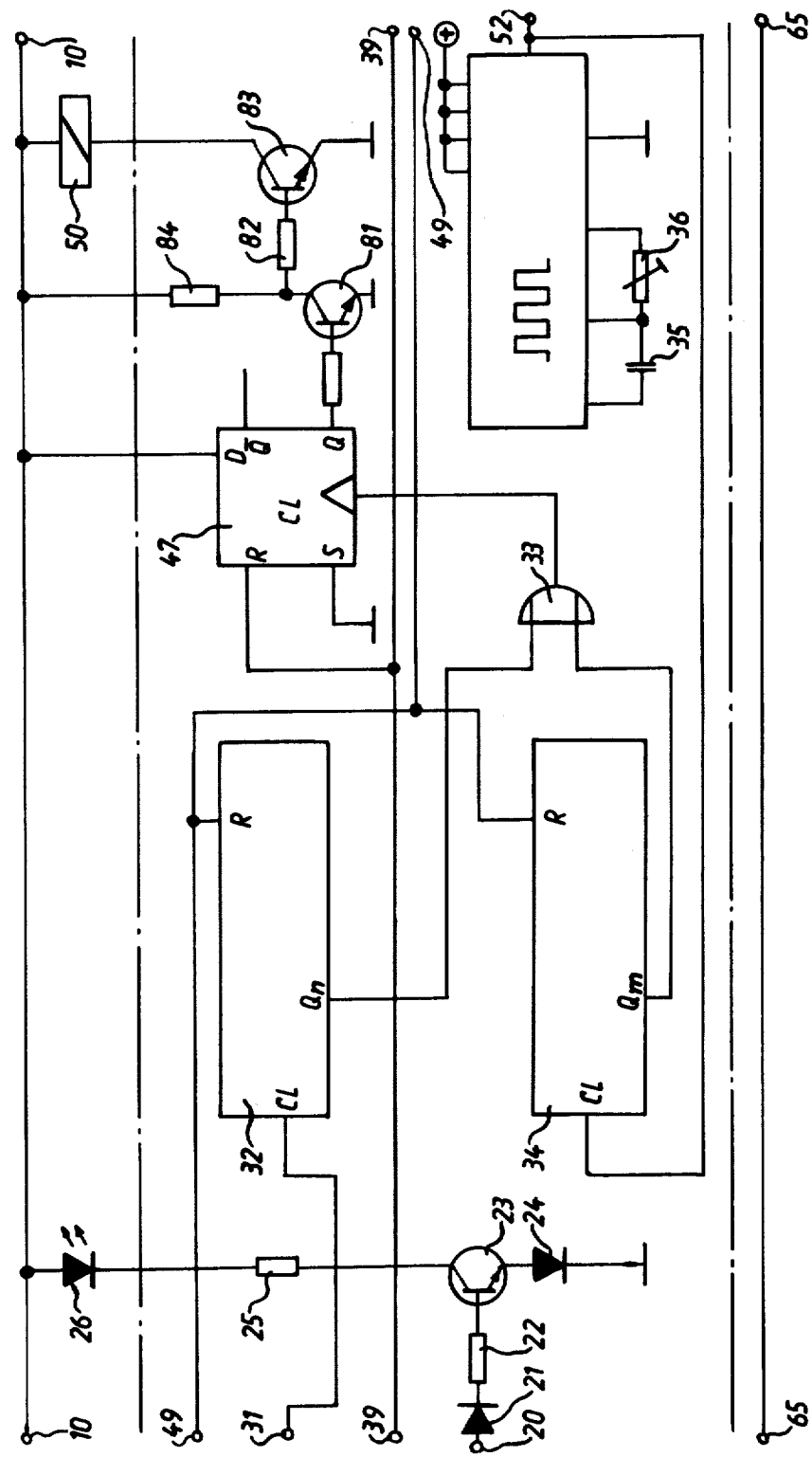
Figure 3:
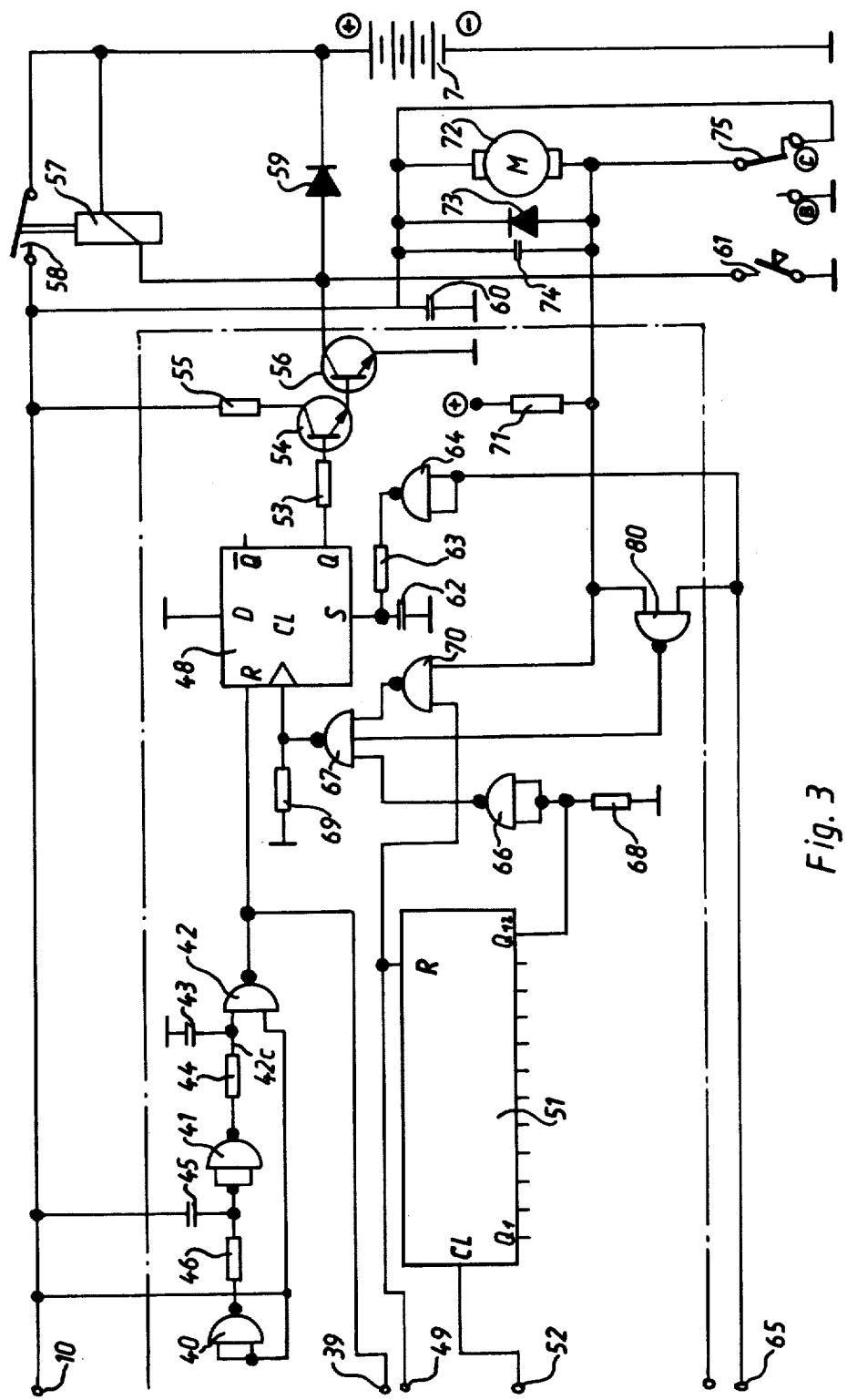

With reference to FIG. 3, certain camera operating components are shown such as a battery 7, a motor 72 used to advance the film in the camera after an exposure is made, and a normally open manually actuated switch 61. The manual switch 61 is connected in series with a relay 57 which actuates a normally open operation control switch 58 whose operating contacts 58a and 58b are connected between the positive terminal of battery 7 and the circuits or segments of FIGS. 1-3 to control the supply of power thereto. Hence, when manual switch 61 is closed, current is drawn through relay 57, switch 58 is closed and power is supplied via a line 58c having terminals 10 to the circuits in FIGS. 1-3.

These circuits provide various camera functions such as an exposure duration control, a minimum illumination level indicator, and an automatic film advance. Since the actuations of manual switch 61 and operation control switch 58 are commonly accompanied by so-called contact-bounce such as between contacts 58a and 58b, care must be taken to assure that the initial application of power from battery 7 disturbs neither the proper sequence nor the proper operations of the camera functions.

Accordingly, a reset control circuit is employed with a reset signal generator which, in response to the battery potential applied to line 58c, generates a reset signal at the output 42a of a NAND gate 42.

The reset signal is applied to bistable devices, such as D-type flip flops, 38, 47 and 48, each of which is thereby brought to a predetermined state, such as where their outputs $\overline{Q}$ are rendered active or have a 1 potential while the complementary outputs Q are inactive or have a 0 potential.

Figure 1:
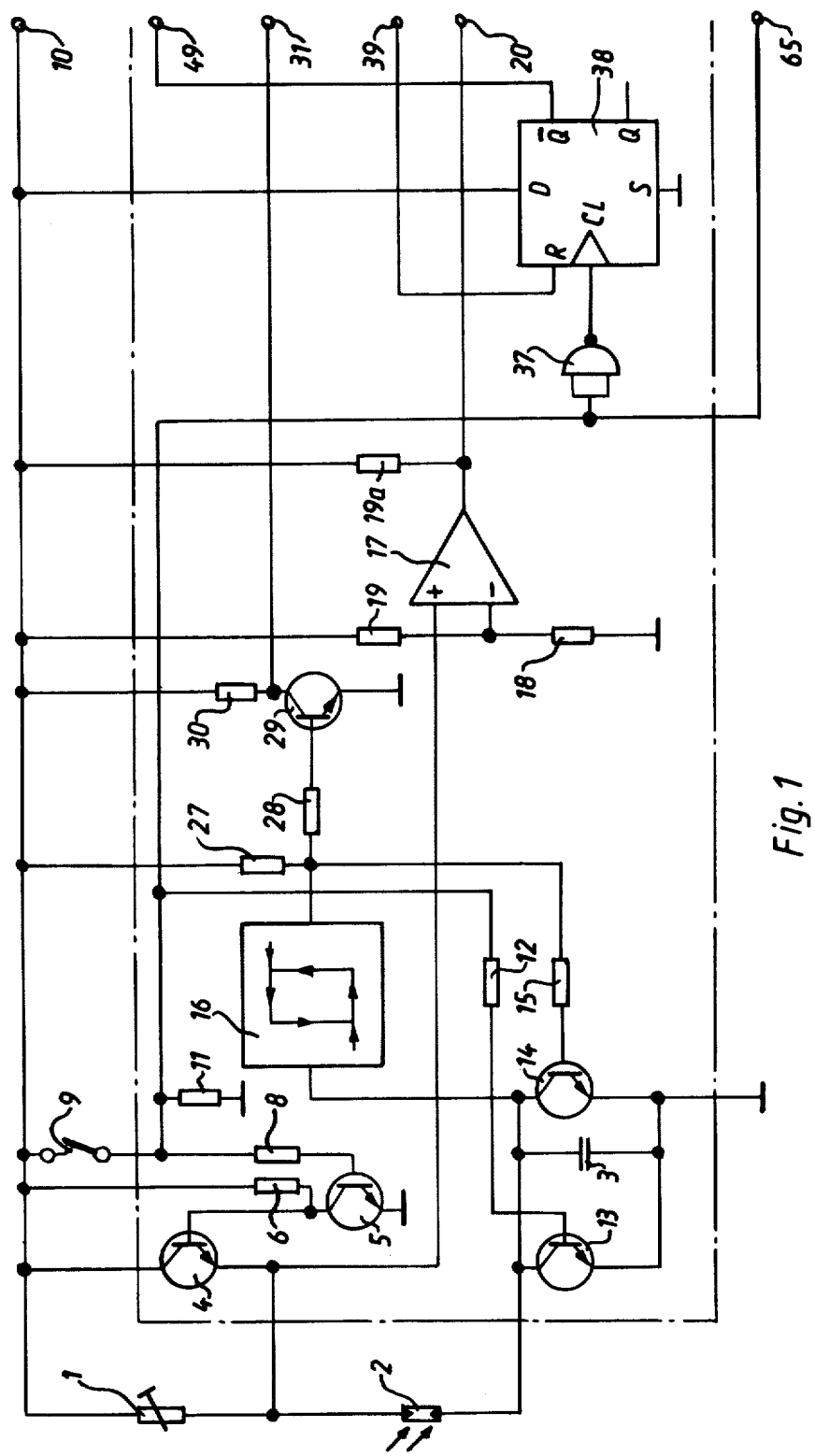
FIGS. 1, 2 and 3 are respectively diagrams of segments of a camera control circuit in accordance with the invention.

In the embodiment of FIGS. 1-3, the active state 1 corresponds to a positive voltage, and the inactive or 0 state corresponds to essentially zero or ground potential.

The bistable devices 38, 47 and 48 also each have a setting input S; the application of an active signal thereto results in opposite states for outputs Q and $\overline{Q}$ than when such signal is applied to the reset input R. In addition, timing or clock inputs CL are provided on flip flops 38, 47, 48 to cause their Q outputs to assume the states of the D inputs when a clocking transition occurs at the CL inputs. The reset inputs R of the listable devices 38 and 47 are connected to the output 42a via conductors having terminals 39.

Each D- flip flop 38, 47, 48 regulates a control circuit. Thus, flip flop 47 regulates opening and closing of an electromagnetic camera shutter control 50; D- flip flop 38 regulates the reset of certain counters 32, 34 and 51;

while D- flip flop 48 is the controlling element in a latching network whereby, following actuation of the manual switch 61, the relay 57 is latched to keep electrical power applied through the operation control switch 58.

Operation of the camera with which the circuits of FIGS. 1-3 function is begun by manually closing switch 61. While holding this closed, relay 57 is energized to apply electrical power through switch 58. This causes a reset signal at output 42a and through D- flip flop 47, semiconductor switches or transistors 81, 83 and electromagnet 50, an immediate opening of the camera shutter (not shown). The camera shutter opening causes a normally closed starting switch 9 in FIG. 1 to open for certain functions as will be explained and also activates a mechanical delaying device (not shown) which provides a delay of predetermined duration. This mechanical delaying device at the end of its time cycle causes starting switch 9 to close again while also causing a motor control switch 75 (FIG. 3) to move to a motor actuating position B, whereby film in the camera is automatically transported to its next exposure position. A film transport counter, not shown, is used to move switch 75 to its normal motor deactivating position C when the film has been transported to its next exposure position.

When the camera shutter is opened and this in turn has opened the normally closed switch 9, an active signal is applied to the setting input S of D- flip flop 48 whose Q output then applies a latching signal to a semiconductor switch or transistor 56 which is in parallel with switch 61. This maintains relay 57 energized and thus also maintains power to the circuits of FIGS. 1-3 from battery 7.

The opening of the camera shutter by electromagnet 50 is maintained for a time interval which is a function of the intensity of the light of the scene being photographed. This is obtained with the following circuits.

With reference to FIG. 1, the numeral 1 denotes a variable resistor which is connected in series with a photoresistor 2 and in parallel with a switching transistor 4. The base of transistor 4 is connected with the collector of a transistor 5 and, via a resistor 6 and line 58c, to the positive pole of battery 7 ( see FIG. 3). The base of the transistor 5 is connected through a resistor 8 and normally closed starting switch 9 to the conductor 58c. The resistor 8 cooperates with another resistor 11 to form a voltage divider.

The starting switch 9 also connects the positive potential in line 58c to the base of a transistor 13 through a resistor 12. The collector-emitter circuit of the transistor 13 is connected in parallel with a time-delay capacitor 3 which is in series with photoresistor 2. The time-delay capacitor 3 is further connected across the collector-emitter circuit of a transistor 14 whose base is connected by a resistor 15 to the output 16a of a Schmitt trigger type multivibrator 16. The Schmitt trigger multivibrator 16 exhibits a hysteresis response to an input signal present on the collector of transistor 14. Multivibrator 16 thus produces, for example, an output pulse in line 16a at one input voltage level while terminating this output pulse at a different lower input voltage. Hence, when starting switch 9 is opened, the speed at which capacitor 3 is charged to the trigger level of Schmitt trigger multivibrator 16 determines the rate at which the latter generates pulses.

The Schmitt trigger type multivibrator 16, the photoresistor 2, the time-delay capacitor 3 and the transistor 14 constitute a pulse generator which oscillates when the starting switch 9 is open and which has a pulse rate in line 16a varying as a function of changes in intensity of light incident upon photoresistor 2.

Starting switch 9 operates as a control whereby, when it is closed, transistors 5 and 13 are conducting, thereby short-circuiting capacitor 3 and the input to multivibrator 16 and preventing output pulses in line 16a. In such case, the resistor 1 and photoresistor 2 constitute a light-dependent voltage divider with a tap which is connected with the non-inverting input of an operational amplifier 17. The inverting input of the operational amplifier 17 is connected with a voltage divider 18, 19. The output of the operational amplifier 17 is connected through a load resistor 19a to line 58c and to the base of a transistor 23 via a conductor having terminals 20 as well as a diode 21 and a resistor 22. The emitter circuit of the transistor 23 contains a diode 24 and the collector circuit of the transistor 23 contains a resistor 25 as well as a light emitting diode 26.

When the starting switch 9 is open, such as when the camera shutter has opened, the output pulses of the Schmitt trigger multivibrator 16 are applied through a resistor 28 to the base of a switching transistor 29 having a collector resistor 30. The resistor 28 cooperates with another transistor 27 to form a voltage divider. Transistor 29 is switched on and off in rhythm with the pulses in line 16a. The collector of transistor 29 is connected to supply the timing input CL of the digital counter 32 with the pulses from line 16a through a conductor having terminals 31. The output Qn of the digital counter 32 is connected with the first input 33a of an OR gate 33. The second input 33b of the OR gate 33 is connected with the output Qm of the digital counter 34 which has a timing input CL connected to the output of a pulse generator 100 having frequency determining components such as capacitor 35 and potentiometer 36.

The counting capacity of the counter 34 and the pulse frequency of the generator 100 are selected in such a manner that the output Qm from counter 34 transmits a control signal after a lapse of a predetermined interval such as 30 ms.

The starter switch 9 further connects the positive potential in line 58c to an inverter 37 (see FIG. 1) whose output is connected to the timing input CL of the dual D- flip flop 38. Hence, while the flip flop 38 is initially reset by a signal at output 42a, this reset state is changed by the transition at the output 37a of inverter 37 when switch 9 is opened.

The reset signal generator is formed of a delay chain of inverters 40, 41 and the NAND gate 42. The input of the first inverter 40 is connected both to line 58c and the first input 42b of the NAND gate 42. The latter has a second input 42c connected to a coupling network 43a formed of a capacitor 43 coupled to ground and a resistor 44 connected to the output of the inverter 41. The input of inverter 41 is connected through a capacitor 45 to the positive pole of the battery 7 via line 58c and to the output of inverter 40 by a resistor 46.

In the event of positive voltage transients in line 58c, the output 42a of the reset signal generator transmits pulses of predetermined width to the reset inputs R of the D- flip flops 38, 47 and 48.

The $\overline{Q}$ output of flip flop 38 is connected to the resetting inputs R of the digital counters 32 and 34 via a conductor having terminals 49. The output 33C of OR gate 33 is connected with the timing input CL of the D- flip flop 47. The Q output of flip flop 47 is connected to the base of the transistor 81 whose collector circuit is connected to line 58c via a resistor 84 and to the base of the transistor 83 through a resistor 82. The collector circuit of the transistor 83 contains the electromagnet 50 which regulates the camera exposure. The armature of the magnet 50 releases the shutter closing elements (not shown) in a manner which is not illustrated in the drawing after an interval of time which is a function of the intensity of scene light and terminates when counter 32 generates a signal at output Qn.

The $\overline{Q}$ output of D- flip flop 38 is further connected to the resetting input R of the counter 51 via the conductor with the terminals 49. The timing input CL of the counter 51 is connected to the output of pulse generator 100 via a conductor having terminals 52. The capacity of the counter 51 and the pulse frequency of the generator 100 are selected in such a way that the output $Q_{12}$ of counter 51 (see FIG. 3), which is connected with a resistor 68 and with the input of an inverter 66, transmits an impulse after a lapse of 5 seconds measured from the time of reset. This control impulse is applied to the timing input CL of D- flip flop 48 through the inverter 66 and a NAND gate 67 having an input 67a connected with the output of the inverter 66. Aside from the timing input CL of flip flop 48, the output of gate 67 is connected with a resistor 69.

The Q output of flip flop 48 is connected by a resistor 53 to the base of a transistor 54 whose collector is coupled by a resistor 55 to line 58c. The emitter of the transistor 54 is connected to the base of the transistor 56 whose collector is connected through relay 57 to contact 58b of switch 58. A diode 59 is connected across the relay 57. A capacitor 60 is connected to contact 58a of switch 58 via line 58c.

When, for example, a lapse of the aforementioned interval of 5 seconds occurs and the output pulse from counter 51 is produced, D- flip flop 48 is switched so that its Q output becomes inactive and both transistors 54, 56 are rendered non-conducting. This causes relay 57 to be de-energized provided that the manually operated release switch 61, which is in parallel with the collector-emitter circuit of the switching transistor 56, was previously opened.

The D input of flip flop 48 is connected to ground, and its setting input S is connected to the starting switch 9 through a delay network formed of a capacitor 62 and a resistor 63 as well as through an inverter 64 and a conductor having terminals 65.

A second input 67c of the NAND gate 67 is connected to the output of a NAND gate 70 having a first input 70a connected with the $\overline{Q}$ output of flip flop 38.

A second input 70b of the NAND gate 70 is connected via a resistor 71 to the positive terminal of battery 7 in line 58c and to one terminal 72a of the film transporting motor 72. The motor 72 is connected in parallel with a diode 73 and a capacitor 74. Terminal 72a of motor 72 is connected to the throw-over switch 75 having the positions C and B. When in the position C, the throw-over switch 75 short-circuits the motor 72 and thus stops it. When switch 75 is in position B, the switch 75 connects terminal 72a of motor 72 to ground.

A third input 67b of the NAND gate 67 is connected with the output of a NAND gate 80. A first input 80a of NAND gate 80 is connected with switch 9 through the conductor having the terminals 65 and a second input 80b of this gate is connected with terminal 72a of motor 72.

The operation of the circuit shown in FIGS. 1, 2 and 3 is as follows.

At the start of making of an exposure, the existing lighting conditions are ascertained by closing the manually operated switch 61 of FIG. 3. This energizes the relay 57, closes the normally open operation control switch 58, and electrically connects the various circuits to battery 7.

Normally, the closing of switch 58 causes bouncing between its contacts 58a and 58b and thus a series of transients in line 58c. Each transient incident upon the inut 42b of the NAND gate 42 causes a positive output pulse at output 42a, the effect of which is to reset the D-flip flops 38, 47 and 48. These pulses have durations which correspond to the time constants in the delay chain formed by coupling network 43a (including resistor 44 and capacitor 43) and coupling network 45a (including capacitor 45 and resistor 46).

In the case of D- flip flop 48, its setting input S has an inactive or zero potential applied to it from inverter 64. Consequently, the Q output is inactive or at zero potential so that both transistors 54 and 56 are rendered non-conducting and relay 57 remains energized only as long as the manually controlled switch 61 is actuated.

Initially, while the camera shutter is being opened and starting switch 9 is still closed, a positive potential is applied to the bases of transistors 5 and 13 rendering them conductive. This, in turn, renders transistor 4 non-conductive while capacitor 3 is short-circuited by the conduction of transistor 13 so that pulse generator 16 is disabled.

While starting switch 9 is closed, the base of transistor 23 receives a light-brightness-dependent signal from the junction between potentiometer 1 and photoresistor 2 by way of operational amplifier 17. If the intensity of light is insufficient, the light emitting diode 26 lights up. On the other hand, this diode does not emit a visible signal when the intensity of light is sufficient for the making of an exposure.

Since the D flip flops 38 and 47 received the reset signal from output 42a, the electromagnet 50 is energized to open the camera shutter while the counters 32, 34 and 51 are reset. At this time the throw-over switch 75 remains in its C position, thus keeping the film transporting motor 72 turned off.

Upon actuation of a camera release (not shown), the camera release itself or a component part thereof which moves in response to opening of the camera shutter causes the starter switch 9 to open. This renders transistor 4 conductive whereas the transistor 13 is switched off or blocked, allowing the multivibrator 16 to oscillate and generate pulses at a rate depending upon the time it takes to charge capacitor 3 to the trigger level for Schmitt trigger multivibrator 16 after the capacitor 3 has been discharged by the conduction of transistor 14. These pulses are counted by counter 32.

Upon opening of the starter switch 9, the timing input CL of the D flip flop 38 receives a rising positive voltage, causing a switching of flip flop 38 so that its output $\bar{Q}$ is rendered inactive with a zero potential and thus removing the resetting signals to inputs R of counters 32, 34 and 51.

The light-dependent impulses from Schmitt trigger multivibrator 16 are counted by counter 32 while the pulses of a fixed frequency from pulse generator 100 are counted by the counters 34 and 51.

In FIG. 3 at this time an inactive or zero signal is applied to input 70a of the NAND gate 70 by flip flop 38 and an active or 1 signal is applied to the other input 70b of this gate from the potential applied through resistor 71. The output of gate 70 is thus active with a "1" and this is applied to input 67c of NAND gate 67.

Until completion of the counting operation, the output $Q_{12}$ of counter 51 has an inactive or zero signal which when applied to the input 67a of the NAND gate 67 becomes an active 1 in view of inverter 66. Consequently, timing input CL of D flip flop 48 has an inactive or zero signal.

After a time delay which is a function of the intensity of light incident upon photoresistor 2, the output Qn of the counter 32 becomes active at 1, and similarly, at some time the output Qm of the fixed counter 34 becomes active. Depending upon which output signal appears first, the output 33c of the OR gate 33 produces an active signal at the timing input CL of flip flop 47 causing the latter to switch so that its output Q becomes active with a 1 potential. This de-energizes the electromagnet 50 allowing a shutter closing element (not shown) to be released and move the shutter to its closed position.

After a delay which commences at the opening of the shutter, a mechanical delay device (not shown) actuates the throw-switch 75 (see FIG. 3) to its B position. This energizes the film transporting motor 72 by completing a circuit which includes the positive pole of the battery 7, the operation control switch 58, motor 72, throw-over switch 75 in the position B and the negative pole of the battery 7.

The motor 72 transports the film by the length of a film frame. This can be achieved, for example, with a mechanical counter which can count the number of perforations corresponding to the length of a film frame. Such number can equal 8. Upon completion of the film transport, i.e. after the mechanical counter has detected the passage of 8 successive perforations in the film, the motor 72 is stopped by a return of the throw-over switch 75 to its C position. Such return movement of the switch 75 to the C position preferably takes place under the action of the motor 72.

With the return of throw-over switch 75 to its C position the input 70b of NAND gate 70 receives an active potential "1" and thus the active potential "1" at the output of the NAND gate 70 remains unchanged.

The input 80b of NAND gate 80 also has the active potential "1". Since in a manner, which is not illustrated in the drawing, the motor 72 returns the shutter to its starting position, the starter switch 9 is returned to its closed position. Hence, the second input 80a of the NAND gate 80 exhibits the active potential "1" so that the output of NAND gate 80 and thus input 67b of NAND gate 67 have the inactive potential "0" while the other inputs 67a and 67c of the gate 67 have the active potential "1". Consequently, the timing input CL of the D- flip flop 48 receives a positive transition causing the potential at the Q output of the D- flip flop 48 to be changed from the value "1" to the value "0".

Hence, after the film transporting operation, the transistor 56 is rendered non-conductive and, therefore, the relay 57 is de-energized allowing the operation control switch 58 to open.

If contact bouncing takes place during opening of the operation control switch 58, such bouncing causes positive voltage transients which are transmitted to the inverter delay chain 40–46. The latter, however, generates the proper reset pulses to each of the reset inputs R of the D- flip flops 38, 47 and 48. Flip flop 48 thus remains in the state in which its Q output has a zero potential and a pulse for a renewed energization of the relay 57 does not occur.

If the throw-over switch 75 is not returned in time to the position C as a result of malfunctions of the film transporting mechanism, the counter 51 becomes effective. After a lapse of 5 seconds, the output $Q_{12}$ of the counter 51 transmits a positive signal which is inverted and is applied to the input 67a of the NAND gate 67. This generates a 1 potential at the timing input of the D-flip flop 48 so tht transistor 56 is cut-off, the relay 57 is de-energized and the operation control switch 58 allowed to open.

Having thus described an embodiment in accordance with the invention its advantages can be understood. Variations can be made without departing from the breadth of the invention.

What is claimed is:

1. In a circuit for the regulation of at least one camera function such as opening of the camera shutter, film exposure, film transport and the like with at least one control circuit which is energized by a source of potential such as a battery having positive and negative terminals through an operation control switch having a first contact coupled to said source and a second contact coupled to said control circuit, the improvement comprising:
    at least one bistable device having a reset input, said device being electrically coupled to said control circuit to establish a predetermined state thereof upon application of a reset signal to said reset input; and
    means coupled to said second contact of said operation control switch for generating a reset signal in response to the application of electrical power to said second contact and to bouncing effects between said first and second contacts.

2. The circuit as claimed in claim 1 wherein said reset signal generating means comprises:
    a chain of serially coupled signal inverting logic elements having an output which provides the reset signal with an input coupled to said second contact of said operation control switch.

3. The circuit as claimed in claim 1 wherein said one bistable device is a D- flip flop.

4. The circuit as claimed in claim 1 and further including:
    means controlled by said one bistable device for latching said operation control switch in a closed state.

5. The circuit as claimed in claim 4 wherein said latching means includes:
    a relay connected to actuate said operation control switch;
    a manually actuated switch coupled to energize said relay; and
    first semiconductor switch means for maintaining energization of said relay in response to a state opposite to said predetermined state of said one bistable device.

6. In a circuit for the regulation of at least one camera function such as opening of the camera shutter, film exposure, film transport and the like with at least one control circuit which is energized by a source of potential such as a battery having positive and negative terminals through an operation control switch having a first contact coupled to said source and a second contact coupled to said control circuit, the improvement comprising:
    at least one bistable device having a reset input, said device being electrically coupled to said control circuit to establish a predetermined state thereof upon application of a reset signal to said reset input; and
    means coupled to said second contact of said operation control switch for generating a reset signal in response to the application of electrical power to said second contact and to bouncing effects between said first and second contacts, said signal generating means including a chain of serially coupled signal inverting logic elements, and coupling networks interposed between said logic elements, said chain having an output which provides the reset signal and an input which is coupled to said second contact, and each of said coupling networks comprising a capacitor which is connected to an input of a respective logic element, at least one of said capacitors also being connected to a terminal of said source during circuit operation.

7. The circuit as claimed in claim 6 wherein said logic elements are formed of a pair of series coupled inverters and an output element in the form of a NAND circuit, said NAND circuit having a first input coupled to said second contact and a second input responsive to the output of said serially coupled inverters.

8. In a circuit for the regulation of at least one camera function such as opening of the camera shutter, film exposure, film transport and the like with at least one control circuit which is energized by a source of potential such as a battery having positive and negative terminals through an operation control switch having a first contact coupled to said source and a second contact coupled to said control circuit, the improvement comprising:
    a plurality of D- flip flops, at least one of said D- flip flops having a reset input and being electrically coupled to said control circuit to establish a predetermined state thereof upon application of a reset signal to said reset input;
    means coupled to said second contact of said operation control switch for generating a reset signal in response to the application of electrical power to said second contact and to bouncing effects between said first and second contacts;
    a pulse generator;
    a counter responsive to pulses produced by said pulse generator and operative to provide an output timing signal when a predetermined number of pulses has been counted; and
    means for applying the output timing signal to a clocking input of one of said D- flip flops to effect a reset state thereof.

9. The circuit as claimed in claim 8 wherein the output timing signal is generated at such count that predetermined camera functions controlled by said circuit have been completed.

10. The circuit as claimed in claims 8 or 9 wherein said output timing signal applying means further comprises:
    a logic circuit having at least first and second inputs, one input being responsive to the output timing signal and another input being responsive to the state of film transport.

11. The circuit as claimed in claim 10 wherein said logic circuit comprises a NAND gate.

12. In a circuit for the regulation of at least one camera function such as opening of the camera shutter, film exposure, film transport and the like with at least one control circuit which is energized by a source of potential such as a battery having positive and negative terminals through an operation control switch having a first contact coupled to said source and a second contact coupled to said control circuit, the improvement comprising:
- at least one bistable device having a reset input, said device being electrically coupled to said control circuit to establish a predetermined state thereof upon application of a reset signal to said reset input;
- means coupled to said second contact of said operation control switch for generating a reset signal in response to the application of electrical power to said second contact and to bouncing effects between said first and second contacts;
- means controlled by a bistable device for latching said operation control switch in a closed state;
- a motor for film transport having first and second motor terminals, one of said motor terminals being connected to said second contact;
- a throw-over switch in series with the other of said motor terminals, said throw-over switch having a first position for actuation of said motor and a second position for shutting off said motor after film transport;
- means for generating a time-out signal at a predetermined interval following the reset signal;
- means responsive to said throw-over switch for generating an end-of-transport signal indicative of the completion of film transport; and
- means responsive to the time-out and end-of-transport signals for causing a reset state of said bistable device which controls latching of said operation control switch and thereby effect an unlatching of the latter.

13. The circuit as claimed in claim 12 wherein said one bistable device is a D- flip flop.

14. The circuit as claimed in claim 12 wherein said bistable device which controls latching of said operation control switch is said one bistable device.

15. The circuit as claimed in claim 14 and further including:
- starting switch means activated upon opening of the camera shutter and deactivated when said motor is operative, and means responsive to said starting switch means for actuating said one bistable device to latch said operation control switch.

16. In a circuit for the regulation of at least one camera function such as opening of the camera shutter, film exposure, film transport and the like with at least one control circuit which is energized by a source of potential such as a battery having positive and negative terminals through an operation control switch having a first contact coupled to said source and a second contact coupled to said control circuit, the improvement comprising:
- a plurality of bistable devices, at least one of said devices having a reset input and being electrically coupled to said control circuit to establish a predetermined state thereof upon application of a reset signal to said reset input;
- means coupled to said second contact of said operation control switch for generating a reset signal in response to the application of electrical power to said second contact and to bouncing effects between said first and second contacts;
- means for transporting film;
- starting switch means activated upon opening of the camera shutter and deactivated when said film transporting means is operative, said starting switch means being arranged such that a starting signal is produced upon deactivation thereof; and
- a counter for counting pulses having a frequency which varies as a function of the intensity of the light from a scene being photographed by the camera, another of said bistable devices being coupled to reset said counter in response to the reset signal and being responsive to the starting signal so as to enable said counter to count pulses upon opening of the camera shutter.

17. The circuit as claimed in claim 16 and further including:
- means including a counter and a pulse generator for generating an output signal a predetermined time following the reset signal, said other bistable device being coupled to initially reset said output signal generating means.

18. The circuit as claimed in claim 16 and further including:
- means for controlling opening of the camera shutter, a third of said bistable devices being coupled to energize said camera shutter controlling means in response to the reset signal so as to open the camera shutter, and said third bistable device being arranged to be deactivated at a predetermined count of said counter to enable closing of the camera shutter.

19. The circuit as claimed in claim 16 wherein said one bistable device is a D- flip flop.

20. In a circuit for the regulation of at least one camera function such as opening of the camera shutter, film exposure, film transport and the like with at least one control circuit which is energized by a source of potential such as a battery having positive and negative terminals through an operation control switch having a first contact coupled to said source and a second contact coupled to said control circuit, the improvement comprising:
- a plurality of bistable devices, at least one of said devices having a reset input and being electrically coupled to said control circuit to establish a predetermined state thereof upon application of a reset signal to said reset input;
- means coupled to said second contact of said operation control switch for generating a reset signal in response to the application of electrical power to said second contact and to bouncing effects between said first and second contacts;
- electromagnet means for controlling opening of the camera shutter, another of said bistable devices being coupled to energize said electromagnet means in response to the reset signal so as to open the camera shutter; and
- means for generating an output signal indicative of the closure time for the camera shutter and applying the output signal so as to deactivate said other bistable device and enable closing of the camera shutter.

21. The circuit as claimed in claim 20 wherein said output signal generating means comprises a pulse counter operative to generate the output signal at a predetermined numer of pulses.

22. The circuit as claimed in claim 20 wherein said reset signal generating means comprises:
   a chain of serially coupled signal inverting logic elements having an output which provides the reset signal and an input which is coupled to said second contact.

23. In a circuit for the regulation of at least one camera function such as opening of the camera shutter, film exposure, film transport and the like with at least one control circuit which is energized by a source of potential such as a battery having positive and negative terminals through an operation control switch having a first contact coupled to said source and a second contact coupled to said control circuit, the improvement comprising:
   at least one bistable device having a reset input, a control input, an additional input and an output which assumes the state of said control input upon arrival of a signal at said additional input, said device being electrically coupled to said control circuit to establish a predetermined state thereof upon application of a reset signal to said reset input;
   signal generating means connecting said reset input with said second contact and operative to generate a reset signal in response to the application of electrical power to said second contact and to bouncing effects between said first and second contacts, said signal generating means including signal inverting delay means; and
   semiconductor means connected with said output and operative to regulate said control circuit in response to signals generated at said output.

24. The circuit as claimed in claim 23 wherein said bistable device further includes a setting input.

25. The circuit as claimed in claim 23 wherein said signal inverting delay means comprises a chain of serially coupled signal inverting logic elements.

26. The circuit as claimed in claim 23 wherein said additional input is a clocking input.

* * * * *